United States Patent
Yokoyama et al.

(10) Patent No.: US 6,287,956 B2
(45) Date of Patent: *Sep. 11, 2001

(54) MULTILEVEL INTERCONNECTING STRUCTURE IN SEMICONDUCTOR DEVICE AND METHOD OF FORMING THE SAME

(75) Inventors: Takashi Yokoyama; Yoshiaki Yamada; Koji Kishimoto, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,115

(22) Filed: Apr. 23, 1998

(30) Foreign Application Priority Data

Apr. 25, 1997 (JP) ..................................................... 9-109291

(51) Int. Cl.[7] ....................... H01L 21/4763; H01L 21/311
(52) U.S. Cl. ......................... 438/624; 438/622; 438/626; 438/631; 438/637; 438/697
(58) Field of Search ..................................... 257/758, 763, 257/753, 751, 752, 764, 915; 438/626, 624, 623, 622, 697, 699, 723, 756, 760, 788, 787, 789, 790, 780, 781, 782, 631, 632, 633, 634, 637

(56) References Cited

U.S. PATENT DOCUMENTS

| | | | |
|---|---|---|---|
| 4,807,016 | * 2/1989 | Douglas | 156/643 |
| 5,225,372 | * 7/1993 | Savkar et al. | 257/763 |
| 5,393,708 | * 2/1995 | Hsia et al. | 438/699 |
| 5,407,847 | * 4/1995 | Hayden et al. | 438/305 |
| 5,414,301 | * 5/1995 | Thomas | 257/740 |
| 5,422,308 | * 6/1995 | Nicholls et al. | 438/233 |
| 5,426,076 | * 6/1995 | Moghadam | 438/699 |
| 5,444,016 | * 8/1995 | Abrokwah et al. | 257/195 |
| 5,527,739 | * 6/1996 | Parrillo et al. | 438/627 |
| 5,567,658 | * 10/1996 | Wang et al. | 438/697 |
| 5,607,773 | * 3/1997 | Ahlburn et al. | 428/427 |
| 5,693,547 | * 12/1997 | Gardner et al. | 148/DIG. 126 |
| 5,710,454 | * 1/1998 | Wu | 257/64 |
| 5,753,975 | * 5/1998 | Matsuno | 257/763 |
| 5,763,010 | * 6/1998 | Guo et al. | 427/376.2 |
| 5,773,360 | * 6/1998 | Chang et al. | 438/626 |
| 5,817,571 | * 10/1998 | Yu et al. | 438/622 |
| 5,874,779 | * 2/1999 | Matsuno | 257/763 |
| 5,888,905 | * 3/1999 | Taylor et al. | 438/705 |
| 6,001,728 | * 12/1999 | Bhan et al. | 438/624 |

FOREIGN PATENT DOCUMENTS

| | | |
|---|---|---|
| 405090249 | * 4/1993 | (JP) . |
| 5-226480 | 9/1993 | (JP) . |
| 409082799 | * 3/1997 | (JP) . |

OTHER PUBLICATIONS

Ida et al, "Reduction of Wiring Capacitance with New Low Dielectric SiOF Interlayer Film for High Speed/Low Power Sub–half Micron CMOS", Symposium on VLSI Technology Digest of Technical Papers 1994, pp59–60, Jun. 1994.*

Fukuda et al, "Highly Reliable SiOF Formation by ECR–CVD using SiF2H2", Symposium on VLSI Technology Digest of Technical Papers 1996, pp 114–115, Jun. 1996.*

Boer et al, "SiOF and SiO2 deposition in a HDP reactor: tool characterisation and film analysis", Materials for Advanced Metalization 1997, pp 71–73, Jun. 1994.*

* cited by examiner

Primary Examiner—Charles Bowers
Assistant Examiner—Thanhha Pham

(57) ABSTRACT

A multilevel interconnecting structure includes a plurality of interconnecting layers formed on a semiconductor substrate, a fluorine-doped oxide film for burying portions between the interconnecting layers, and an oxide film formed on the fluorine-doped oxide film, having a planarized surface, and not containing fluorine. A method of forming the multilevel interconnecting structure is also disclosed.

13 Claims, 7 Drawing Sheets

MULTILEVEL INTERCONNECTING STRUCTURE IN SEMICONDUCTOR DEVICE AND METHOD OF FORMING THE SAME

BACKGROUND OF THE INVENTION

1. Field of the Invention

The present invention relates to a multilevel interconnecting structure in a semiconductor device and a method of forming the same and, more particularly, to a multilevel interconnecting structure in a semiconductor device, in which the dielectric constant of an insulating interlayer is decreased at the same time the insulating interlayer is planarized, and a method of forming the same.

2. Description of the Prior Art

Recently, as semiconductor integrated circuits continue to be miniaturized and increase in degree of integration, the miniaturization of interconnection pitches and the formation of multilevel interconnections have significantly progressed. Under the circumstances, in logic semiconductor devices the dielectric constant of an insulating interlayer is required to be decreased because it is essential to reduce the propagation delay of signals. Therefore, it is being studied to form a fluorine-doped silicon oxide film (to be referred to as an SiOF film hereinafter) as a low dielectric film by supplying a fluorine-containing gas by using a high-density plasma CVD (to be referred to as HDP-CVD) apparatus. This HDP-CVD SiOF film as a low dielectric film can be well buried in an inter-interconnection space of 0.25 μm or less which is difficult to fill with a silicon oxide film formed by plasma excitation CVD (to be referred to as PE-CVD hereinafter) using a conventional reaction gas such as TEOS (tetraethylorthosilicate). This is so because when a film is deposited by HDP-CVD, a bias is applied to a substrate to perform sputter etching simultaneously with the film formation. In this method, particularly the edges of the silicon oxide film deposited on an interconnection are selectively etched to improve the burying property of the film.

In memory semiconductor devices, particularly dynamic random access memories (DRAMS), as in logic semiconductor devices, the miniaturization of interconnections and the formation of multilevel interconnections have advanced, and especially the burying property of an insulating interlayer is a problem. However, an apparatus such as an HDP-CVD apparatus which generates high-density plasma has a large sputter etching effect as described above. This extremely lowers the deposition rate of a film and tends to increase the fabrication cost. Accordingly, a method is being studied which improves the burying property of an insulating interlayer by supplying a fluorine-based gas into a parallel plate PE-CVD apparatus to form an SiOF film.

Normally, in logic semiconductor devices an SiOF film can be easily planarized by chemical mechanical polishing (CMP). However, in DRAMs among other memory semiconductor devices, a capacitor is often formed on a MOS transistor in a memory cell. To obtain a large area of a capacitor electrode in a narrow region, the capacitor electrode tends to vertically extend. This increases the step between the memory cell and its peripheral circuit. When an insulating interlayer on the interconnection is polished by CMP, this step is difficult to reduce. This will be described with reference to FIGS. 1A and 1B. FIGS. 1A and 1B are schematic sectional views showing a part of a DRAM.

As shown in FIG. 1A, a first undercoating insulating film 101 is formed on a semiconductor substrate 100. In a memory cell, a second undercoating insulating film 102 is so formed as to cover a capacitor. An interconnecting layer 103 is formed on the surface of the first undercoating insulating film 101 in a peripheral circuit of the DRAM. Also, an interconnecting layer 103a is formed on the second insulating film 102 in the memory cell of the DRAM.

An insulating interlayer 104 is so deposited as to cover the interconnecting layers 103 and 103a formed in the memory cell and the peripheral circuit having a step between them as described above. This insulating interlayer 104 is an SiOF film.

Next, as shown in FIG. 1B, the insulating interlayer 104 is polished by CMP. However, a step is present between the interconnecting layer 103 in the peripheral circuit and the interconnecting layer 103a in the memory cell. Therefore, even when the insulating interlayer 104 on the interconnecting layer 103a in the memory cell is polished and planarized, the insulating interlayer 104 in the peripheral circuit is not polished. Consequently, the insulating interlayer 104 in the peripheral circuit becomes uneven in accordance with the pattern of the interconnecting layer. This unevenness increases as the semiconductor device structure continues to shrink in feature size as described above.

In addition to the method of forming an insulating interlayer as described above, it is possible to use a method in which a planarizing film is stacked on an insulating interlayer and etched back to planarize the surface of the insulating interlayer. As the planarizing film, a photoresist or SOG (Spin On Glass) is used. A method using a photoresist as the planarizing film is described in detail in Japanese Unexamined Patent Publication No. 5-226480. Therefore, a method of etching back an SOG planarizing film will be described below with reference to FIGS. 2A to 2D. FIGS. 2A to 2D are sectional views showing steps of forming this insulating interlayer in order.

As shown in FIG. 2A, an undercoating insulating film 202 is formed by, e.g., a silicon oxide film on a silicon substrate 201. Subsequently, a first interconnecting layer 203 is formed on the undercoating insulating film 202, and an antireflection film 204 is formed on top of the first interconnecting layer 203. A first protective insulating film 205 is then deposited so as to cover the entire surface.

Next, an SiOF film 206 is deposited on the protective insulating film 205. An SOG film 207 is formed on this SiOF film 206 to planarize the surface of the SiOF film 206.

As shown in FIG. 2B, the SOG film 207 and the surface of the SiOF film 206 are etched back. This etching back is done by a method of dry etching using a fluorine-based gas. Next, ad shown in FIG. 2C, a second protective insulating film 208 is deposited on the etched back SiOF film 206. This second protective film 208 is also a silicon oxide film formed by PE-CVD.

As shown in FIG. 2D, through holes 209 are formed in predetermined regions of the second protective insulating film 208 and the SiOF film 206. Finally, a second interconnecting layer 210 electrically connecting with the first interconnecting layer 203 is formed.

In the above prior art, when the etching of the SOG film proceeds to expose the SiOF film and the SOG film in the etching back step, the SOG film is rapidly etched by fluorine released from the surface of the SiOF film.

This makes it difficult to planarize the step of the SiOF film in the step of forming the SOG film on the SiOF film and etching back the films by dry etching. Consequently, the overlying interconnecting layer formed on the SiOF film is broken or short-circuited. Alternatively, good image forming performance becomes difficult to obtain in photolithography in the pattern formation in the next step.

Also, after the formation of the SiOF film, atmospheric water or water in the SOG film readily enters and remains in the SiOF film. This increases the amount of water contained in the SiOF film. This water oozes out from the side walls of the through holes when the through holes are filled with a metal film. Consequently, the resistance of the interconnection in the through hole increases, or the interconnection breaks. Furthermore, this increase of the water amount in the SiOF film increases the relative dielectric constant of the film to make the dielectric constant between the interconnecting layers difficult to decrease.

SUMMARY OF THE INVENTION

The present invention has been made in consideration of the above situations in the prior arts and has as its object to provide a multilevel interconnecting structure in a semiconductor device, in which the dielectric constant of an insulating interlayer is decreased by using an SiOF film as the insulating interlayer and which has high planarity and reliability, and a method of forming the structure.

To achieve the above object, according to the first aspect of the present invention, there is provided a multilevel interconnecting structure characterized by comprising a plurality of interconnecting layers formed on a semiconductor substrate, a fluorine-doped oxide film for burying portions between the interconnecting layers, and an oxide film formed on the fluorine-doped oxide film, having a planarized surface, and not containing fluorine.

According to the second aspect of the present invention, there is provided a multilevel interconnecting structure characterized by comprising a plurality of interconnecting layers formed on a semiconductor substrate, a fluorine-doped oxide film for burying portions between the interconnecting layers, an oxide film formed on the fluorine-doped oxide film by plasma CVD, having a planarized surface, and not containing fluorine, and a spin on glass (SOG) film formed on the oxide film not containing fluorine.

According to the third aspect of the present invention, there is provided a multilevel interconnecting structure according to the above first or second aspect, characterized in that a fluorine concentration in the fluorine-doped oxide film does not exceed 10 at %.

According to the fourth aspect of the present invention, there is provided a method of forming a multilevel interconnecting structure, characterized by comprising the steps of forming a first interconnecting layer via an insulating film on a semiconductor substrate, forming an SiOF film as a fluorine-doped oxide film, forming an intermediate insulating film as an oxide film not containing fluorine, planarizing a surface of the intermediate insulating film by an SOG film formed by coating an entire surface of the intermediate insulating film with an SOG coating solution, etching back surfaces of the SOG film and the intermediate insulating film by dry etching using a fluorine-based gas, forming a through hole reaching the first interconnecting layer in a predetermined position, and forming a second interconnecting layer electrically connected to the first interconnecting layer.

According to the fifth aspect of the present invention, there is provided a method of forming a multilevel interconnecting structure according to the above fourth aspect, characterized in that the SiOF film and the intermediate insulating film are continuously deposited in the same film formation apparatus.

According to the sixth aspect of the present invention, there is provided a method of forming a multilevel interconnecting structure according to the above fourth or fifth aspect, characterized in that a silicon oxide film is formed on an entire surface after the etching back step.

According to the seventh aspect of the present invention, there is provided a method of forming a multilevel interconnecting structure according to one of the above fourth to sixth aspects, characterized in that the first interconnecting layer is covered with a silicon oxide film before the SiOF film is formed on the first interconnecting layer.

According to the eighth aspect of the present invention, there is provided a method of forming a multilevel interconnecting structure according to one of the above fourth to seventh aspects, characterized in that the SiOF film and the intermediate insulating film are formed by using a parallel plate PE-CVD apparatus or a high-density plasma excitation CVD apparatus.

According to the ninth aspect of the present invention, there is provided a method of forming a multilevel interconnecting structure according to one of the above fourth to ninth aspects, characterized in that the SiOF film is formed by using a silane-based gas or tetraethylorthosilicate (TEOS), a fluorine-based gas or triethoxyfluorosilane (TEFS), and oxygen as source gases.

According to the 10th aspect of the present invention, there is provided a method of forming a multilevel interconnecting structure according to one of the above fourth to ninth aspects, characterized in that the fluorine-based gas is at least one gas selected from the group consisting of $CF_4$, $C_2F_6$, $NF_3$, and $SiF_4$.

According to the 11th aspect of the present invention, there is provided a method of forming a multilevel interconnecting structure according to one of the above fourth to 10th aspects, characterized in that in the etching back step, the dry etching is performed so as to leave the buried SOG film in regions formed between the interconnecting layers.

According to the 12th aspect of the present invention, there is provided a method of forming a multilevel interconnecting structure according to one of the above fourth to 11th aspects, characterized in that in the etching back step, the dry etching is stopped before the SiOF film on the first interconnecting layer is exposed so as to leave the intermediate insulating film on the SiOF film.

According to the 13th aspect of the present invention, there is provided a method of forming a multilevel interconnecting structure according to one of the above fourth to 12th aspects, characterized in that in the etching back step, etching rates on a surface of the SOG film and a surface of the intermediate insulating film are set to be equal to each other.

In the present invention as is apparent from the above aspects, an SiOF film is formed on an interconnecting layer, an oxide film not containing fluorine, i.e., an intermediate insulating film is formed on the SiOF film, and an SOG film as a planarizing film and the like are formed on the intermediate insulating film.

The intermediate insulating film has the following important functions. That is, the first function is to greatly improve the accuracy of the etching back using a planarizing film such as an SOG film. Since no fluorine is contained in the intermediate insulating film, the etching rates of the planarizing film and the intermediate insulating film can be easily made equivalent to each other in the etching back step.

The second function is to prevent water from entering the SiOF film having high moisture absorption. This prevents an increase in the dielectric constant of the SiOF film and eliminates corrosion of the interconnection in the through hole caused by water.

In the present invention as described above, steps on the SiOF film can be easily planarized in the step of forming the SOG film via the intermediate insulating film and etching back the SOG film by dry etching. Consequently, the overlayering interconnection formed on the SiOF film is neither broken nor short-circuited. In addition, good image forming performance can be readily obtained in photolithography in the pattern formation in the next step.

Also, the resistance of the interconnection in the through hole is not increased by water contained in the SiOF film, and the interconnection is not broken.

Furthermore, corrosion is not caused by the reaction of fluorine in the SiOF film and the interconnecting line such as aluminum, and the adhesion of the SiOF film to aluminum or TiN as the antireflection film is improved. This eliminates the problem of peeling of the SiOF film.

Consequently, in a semiconductor device having an SiOF film as an insulating interlayer, there is provided a reliable multilevel interconnecting structure which decreases the dielectric constant of the insulating interlayer and has high planarity. The formation of the multilevel interconnecting structure is also facilitated.

The above and many other objects, features and additional advantages of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described below with reference to the accompanying drawings.

FIGS. 3A to 3E are sectional views showing the first embodiment of the present invention in order of principal fabrication steps. A multilevel interconnecting structure of the present invention will be explained in this fabrication process.

Figure 1A:
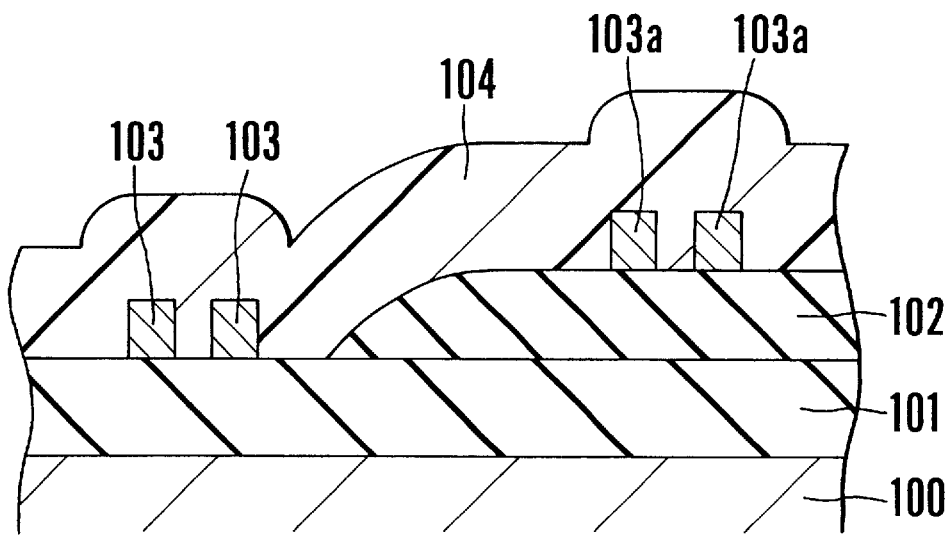
FIGS. 1A and 1B are schematic sectional views showing the first prior art in order of principal fabrication steps.
Figure 1B:
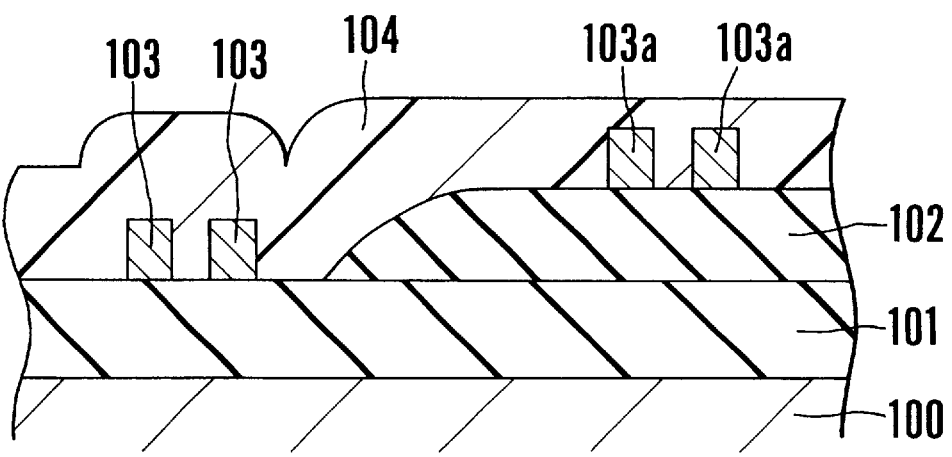
Figure 2A:
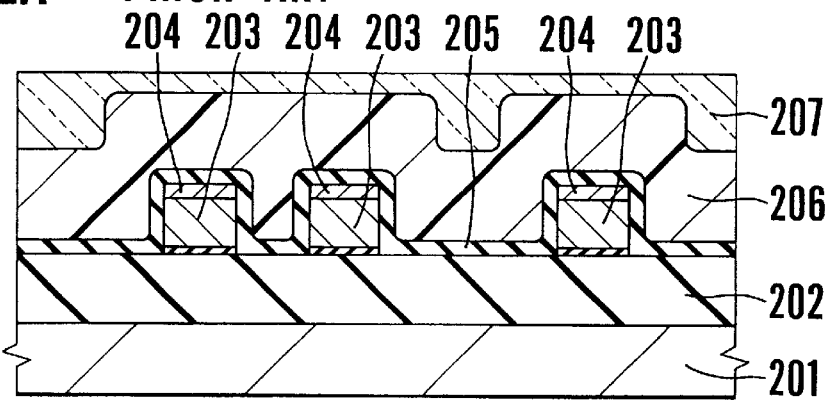
FIGS. 2A to 2D are schematic sectional views showing the second prior art in order of principal fabrication steps.
Figure 2B:
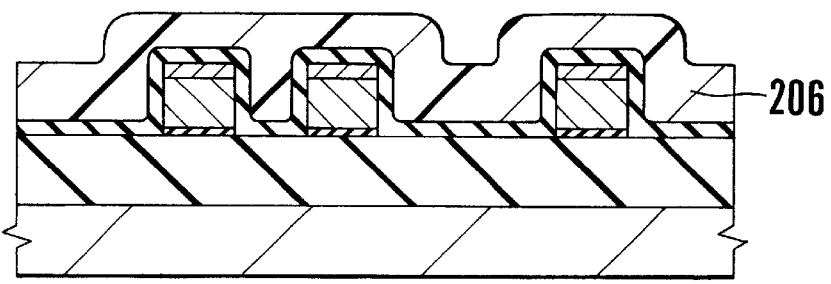
Figure 2C:
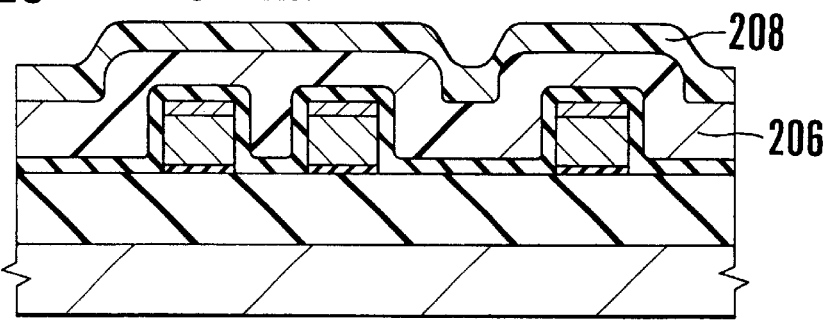
Figure 2D:
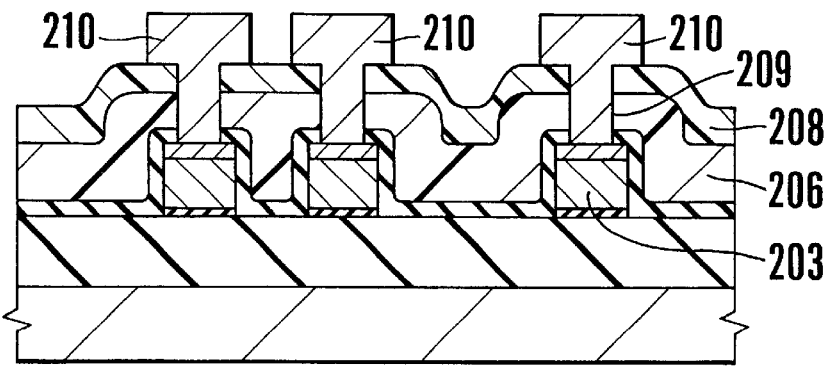
Figure 3A:
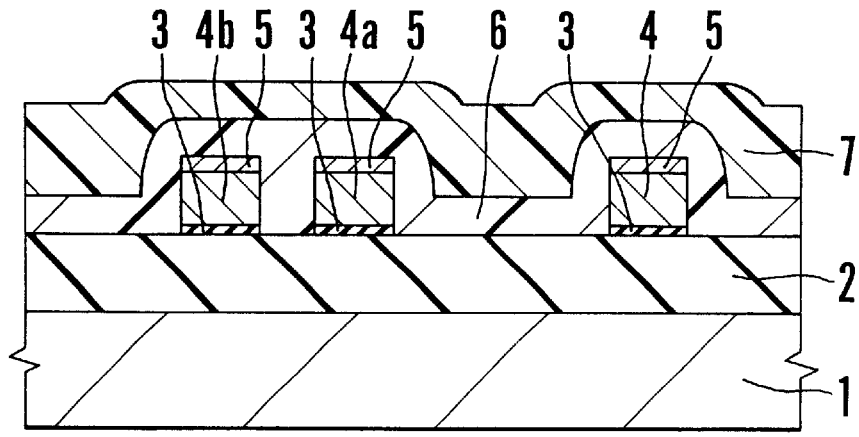
FIGS. 3A to 3E are schematic sectional views showing the first embodiment of the present invention in order of principal fabrication steps.

As shown in FIG. 3A, an undercoating insulating film 2 is formed on a silicon substrate 1 as in the prior arts. Subsequently, an interconnecting layer is formed by stacking a first barrier layer 3, a first interconnecting layer 4, and an antireflection film 5 on the undercoating insulating film 2. A 300- to 800-nm thick SiOF film 6 is so deposited as to cover the entire surface. This SiOF film is deposited as follows.

That is, the SiOF film 6 is formed by supplying a gas mixture of TEOS or $SiH_4$-based gas, a fluorine-based gas (e.g., $C_2F_6$ or TEFS), oxygen, and helium as reaction gases to a common parallel plate PE-CVD apparatus. When TEOS and $C_2F_6$ are used, the fluorine concentration in the SiOF film is adjusted at 2 to 10 at % by the power (RF power) of the PE-CVD apparatus, the substrate temperature, the gas mixture flow rates, and the like factor during the film formation. This fluorine concentration of the SiOF film will be explained later with reference to FIG. 4.

Practical film formation conditions are that the flow rates of TEOS source gas, $C_2F_6$ gas, oxygen gas, and helium gas are 50 to 200 SCCM, 300 to 600 SCCM, 500 to 2,000 SCCM, and 500 to 2,500 SCCM, respectively, the RF power is 800 to 1,000 W, and the substrate temperature is 300 to 400° C. When TEOS and TEFS are used, the flow rates of TEOS source gas, TEFS gas, oxygen gas, and helium gas are 50 to 150 SCCM, 10 to 100 SCCM, 500 to 2,000 SCCM, and 500 to 2,500 SCCM, respectively, the RF power is 400 to 800 W, and the substrate temperature is 300 to 400° C.

Subsequently, in the same parallel plate PE-CVD apparatus, an intermediate insulating film 7 is formed on the SiOF film 6 by using TEOS gas as a reaction gas. This intermediate insulating film 7 is a silicon oxide film about 500 nm thick not containing fluorine.

When the SiOF film 6 is deposited, the SiOF film 6 has a nearly flat surface with no step in a portion where the inter-interconnection space is narrow, such as between first interconnecting layers 4a and 4b. However, a step substantially equivalent to the film thickness of the interconnecting layer is formed in a portion where the inter-interconnection space is wide, such as between the first interconnecting layers 4 and 4a, or in the vicinity of an isolated interconnecting layer.

Note that when deposited the SiOF film 6 is simultaneously etched by fluorine radicals or ions generated by $C_2F_6$ as the addition gas. Since this etching is faster on the shoulders of the interconnecting layer, the SiOF film 6 is well buried without forming any gap in an inter-interconnection space of about 0.25 μm. However, if the film thickness of the SiOF film 6 is smaller than 300 nm, the step shoulders are not sufficiently etched in, a portion where the SiOF film 6 cannot be buried between the interconnecting layers. Consequently, a void is formed between the interconnecting layers between which the SiOF film 6 is not buried. If the film thickness of the SiOF film 6 is larger than 800 nm, the SiOF film 6 entirely remains on the first interconnecting layers 4, 4a, and 4b. This excessively increases the thickness of the film on the first interconnecting layers. From the foregoing, the film thickness of the SiOF film 6 is desirably 300 to 800 nm.

When the intermediate insulating film 7 is formed on this SiOF film 6, a step as described above is reduced to some extent.

Figure 3B:
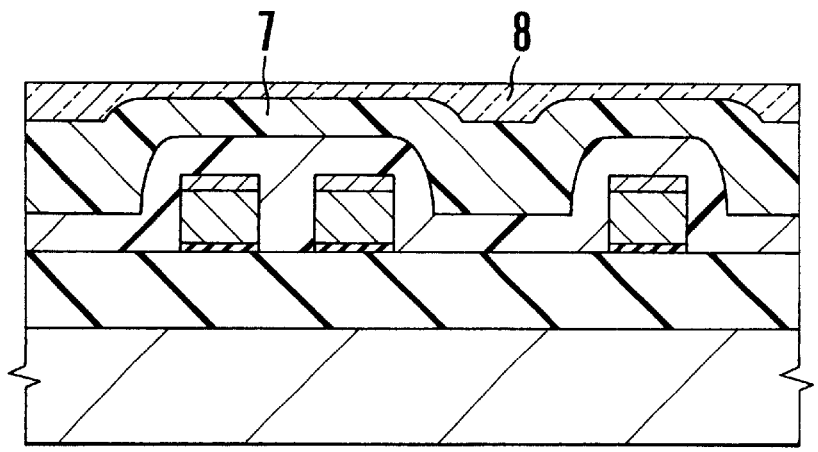

Next, as shown in FIG. 3B, an SOG film 8 about 200 nm thick is formed on this intermediate insulating film 7 to completely planarize the surface of the intermediate insulating film. This SOG film 8 is formed by spin coating of an inorganic SOG film coating solution and subsequent sintering. If the step is not eliminated by performing coating of the SOG film coating solution once, the SOG film is formed by performing coating and sintering a plurality of number of times.

Figure 3C:
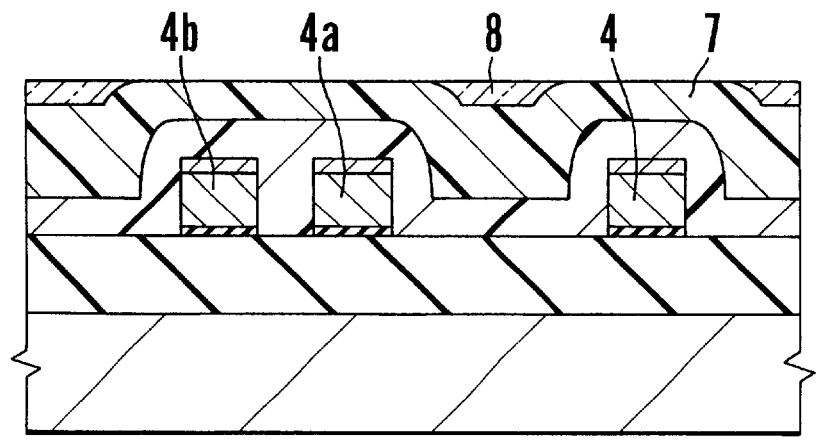

As shown in FIG. 3C, a fluorine-based gas (e.g., $CHF_3$, $CF_4$, $C_2F_6$, $NF_3$, or $SiF_4$) is used to etch back the surfaces of the SOG film 8 and the intermediate insulating film 7 by dry etching. More specifically, the etching back is performed under conditions that the flow rates of $C_2F_6$ gas and helium gas are 10 to 30 SCCM and about 100 SCCM, respectively, the gas pressure is 200 to 300 Pa, and the etching power is 350 to 400 W. Under the conditions, the etching rates of the intermediate insulating film 7 and the SOG film 8 have no big difference, so uniform etching back proceeds to form a completely flat surface as shown in FIG. 3C. In this etching back step, thin SOG film portions above the first interconnecting layer are first etched away to expose the surface of the underlying intermediate insulating film 7. The etching back is continued until the intermediate insulating film 7 has a desired film thickness. Finally, the SOG film 8 remains between the first interconnecting layers. This intermediate insulating film 7 greatly improves the accuracy of the etching back using the SOG film 8. The accuracy of the planarization is greatly improved when the etching rates of the intermediate insulating film 7 and the SOG film 8 are made equal.

Figure 3D:
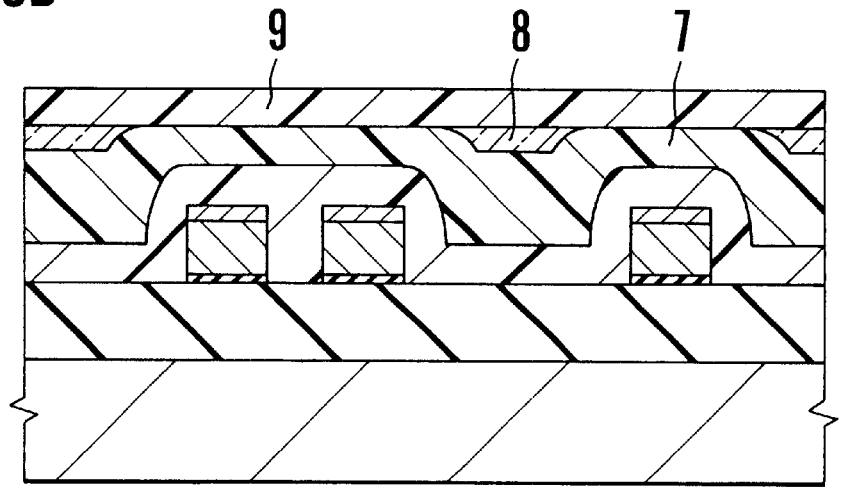

Next, as shown in FIG. 3D, an upper insulating film 9 is deposited on the entire surface. This upper insulating film 9 is a silicon oxide film about 200 thick. When an interconnecting layer is formed in contact with the SOG film 8, the interconnecting layer sometimes corrodes or peels due to the influence of an impurity or water in the SOG film 8. The upper insulating film 9 prevents these adverse effects. If the interconnection step is not sufficiently eliminated at this point, the coating of an SOG film is again performed and the etching back step is repeated to further planarize the surface.

Figure 3E:
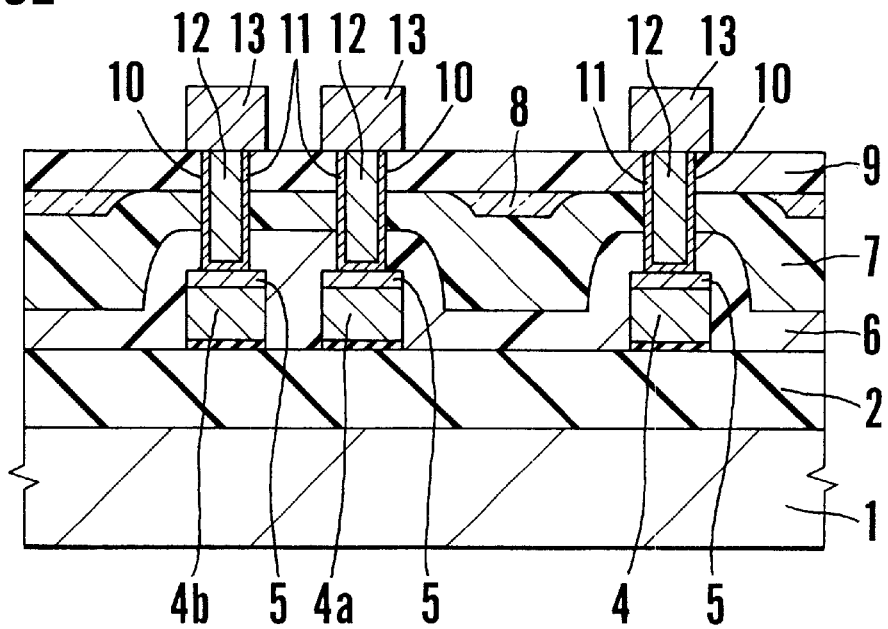

Thereafter, as shown in FIG. 3E, well-known photolithography and etching are performed to form through holes 10 in the SiOF film 3, the intermediate insulating film 7, and the upper insulating film 9 on the first interconnecting layers 4, 4a, and 4b. Subsequently, a second barrier layer 7 is formed by sputtering or CVD of a titanium-based metal. After a metal such as tungsten (W) is deposited by low-pressure CVD at about 450° C., etching back is performed until W remains only in the through holes 10, forming metal plugs 12. A second interconnecting layer 13 is formed on these metal plugs by a well-known technique. To further increase the number of layers, the aforementioned steps are repeated.

In the first embodiment, the SiOF film is formed by a parallel plate PE-CVD apparatus. However, the formation method of the SiOF film is not limited to this method. For example, the SiOF film can also be formed by an HDP-CVD apparatus using a high-density plasma source such as ICP or ECR.

As described above, the function of the intermediate insulating film 7 used in the above embodiment is to greatly improve the accuracy of the etching back using the SOG film 8. This is possible because the intermediate insulating film 7 contains no fluorine, so the etching rates of the SOG film 8 and the intermediate insulating film 7 can be readily made equivalent to each other in the etching back step. Another function of this intermediate insulating film is to prevent water from entering into the SiOF film from the SOG film containing a large amount of water. This function prevents an increase in the relative dielectric constant of the SiOF film and prevents corrosion of the interconnections in the through holes caused by this water.

The moisture absorption, however, of the SiOF film 6 as described above increases if the fluorine concentration increases. If the intermediate insulating film 7 contains water, this water is absorbed to increase the dielectric constant of the SiOF film. Therefore, the present inventors have studied the fluorine concentration in an SiOF film and the moisture absorption of the film.

Figure 4:
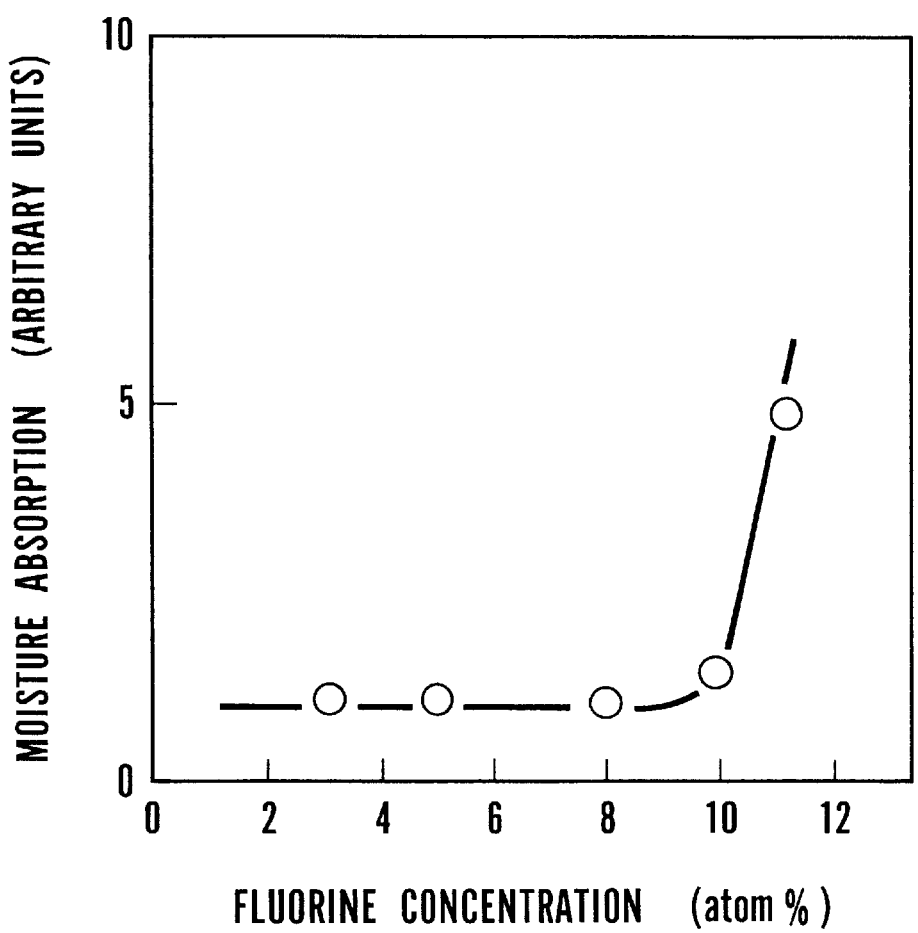
FIG. 4 is a graph for explaining the fluorine concentration in an SiOF film in the first embodiment of the present invention.

FIG. 4 shows the relationship between the moisture absorption and the fluorine concentration of an SiOF film. This SiOF film was formed by the method explained in the above embodiment. The moisture absorption was measured as a change in the weight of water absorption when a film was left to stand in the air after being formed.

As can be seen from FIG. 4, when the fluorine concentration in the SiOF film exceeded 10 at %, the moisture absorption of the film abruptly increased. This indicates that when an intermediate insulating film contains a large amount of water as in the above embodiment, it is preferable to set the fluorine concentration in an SiOF film to 10 at % or less.

Figure 5A:
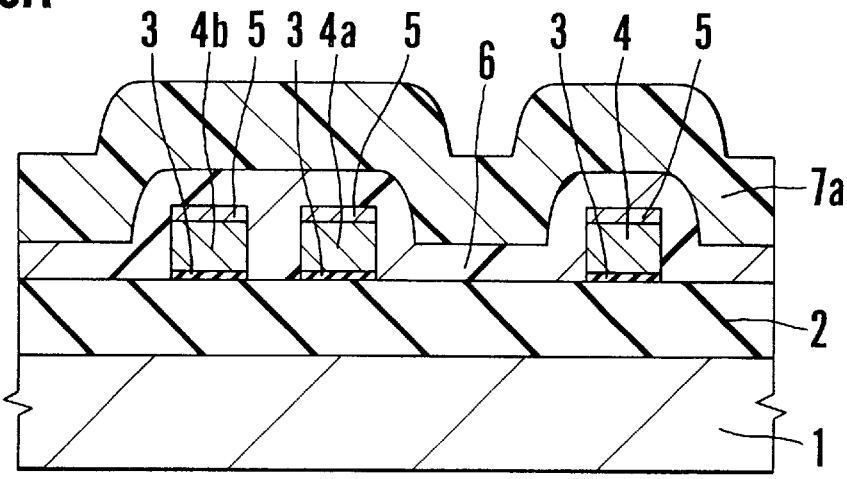
FIGS. 5A to 5C are schematic sectional views showing the second embodiment of the present invention in order of principal fabrication steps.
Figure 5B:
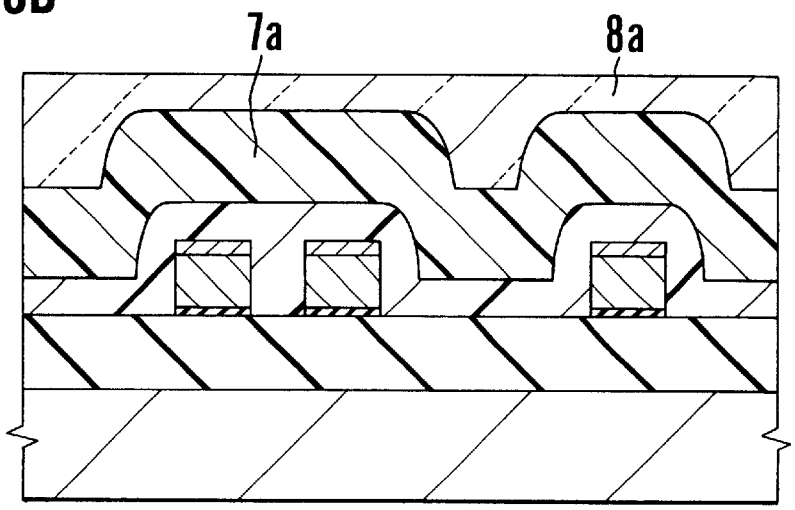
Figure 5C:
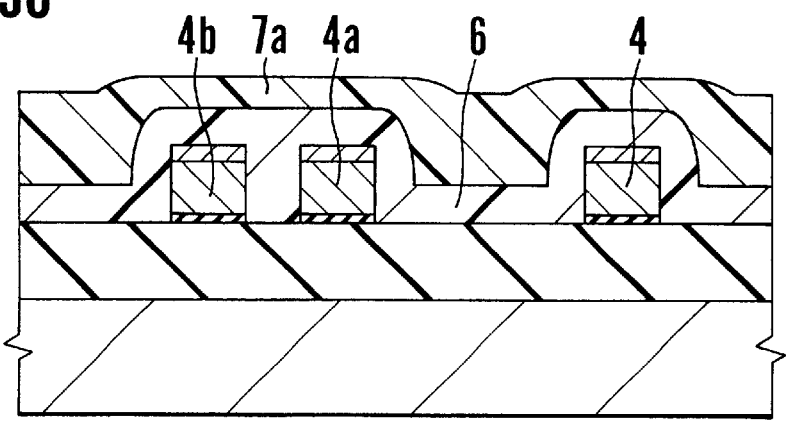

The second embodiment of the present invention will be described below with reference to FIGS. 5A to 5C. FIGS. 5A to 5C are sectional views showing the principal fabrication steps of this embodiment in order. Note that the same reference numerals as in the first embodiment of the present invention denotes the same parts in FIGS. 5A to 5C.

As shown in FIG. 5A, an undercoating insulating film 2 is formed on a silicon substrate 1. As in the first embodiment, an interconnecting layer is formed by stacking a first barrier layer 3, a first interconnecting layer 4, and an antireflection film 5. Also, an SiOF film 6 about 400 nm thick is so deposited as to cover the entire surface. This SiOF film 6 is deposited following the same procedure as explained in the first embodiment. However, in this second embodiment the concentration of fluorine contained in the SiOF film 6 can exceed 10 at %.

Next, an intermediate insulating film 7a is deposited on the SiOF film 6. This intermediate insulating film 7a is a silicon oxide film about 1,000 nm thick. This silicon oxide film is continuously formed in situ in a parallel plate PE-CVD apparatus by using a gas mixture of $SiH_4$ and $N_2O$ as reaction gases. In this method, neither water nor a hydroxyl group is contained in the intermediate insulating film 7a. However, the coverage when the intermediate insulating film 7a is formed is worse than that of the intermediate film 7.

As shown in FIG. 5B, an SOG film 8a about 500 nm thick is formed on the intermediate insulating film 7a to completely planarize the surface of the intermediate insulating film 7a. This SOG film 8a is formed by spin coating of an organic SOG film coating solution and subsequent sintering.

Next, as shown in FIG. 5C, a gas mixture of $CF_4$ and a slight amount of oxygen is used to etch back the surfaces of the SOG film 8a and the intermediate insulating film 7a by dry etching. In this etching back step, thin SOG film portions above first interconnecting layers 4, 4a, and 4b are first etched away to expose the surface of the underlying intermediate insulating film 7a. The etching back is continued until the intermediate insulating film 7a has a desired film thickness, thereby completely removing the SOG film 8a. In this etching back step, the etching rate of the SOG film 8a is so set as to be slightly higher than that of the intermediate insulating film 7a.

Subsequently, as in the first embodiment described with reference to FIG. 3E, through holes, a second barrier layer, metal plugs, and a second interconnecting layer are formed.

An insulating interlayer was formed by a conventional technique by which an SOG film was formed on an SiOF film on a first interconnecting layer about 500 nm thick and etched back and a silicon oxide film was further formed, and through holes were filled with W plugs. Consequently, through holes up to 0.6 μm in diameter could be formed at a percentage non-defective of almost 100%, but smaller through holes had defects. This percentage defective was higher for smaller through holes. The reason for this is as follows. That is, water entered into the SiOF film from the air or the SOG film when the W plugs were formed after the formation of the through holes. When a TiN/Ti film was formed as an undercoating film for W by sputtering or W was formed on this TiN/Ti film by CVD, this water was released from the SiOF film to oxidize T, TiN, or W or make the film formation impossible.

On the other hand, after the SiOF film and the intermediate insulating film 7a were continuously formed in the same PE-CVD apparatus, an SOG film was formed and completely removed by etching back, the film thickness of an insulating interlayer on the first interconnection was made equal to that in the conventional technique, and through holes were filled with W plugs. Consequently, the percentage non-defective was almost 100% even for through holes 0.4 μm in diameter. This is so because the SiOF film was not brought into contact with the air or the SOG film after being formed and hence hardly contained water. If water is contained in the SiOF film, the relative dielectric constant increases. However, in the method of the present invention the relative dielectric constant is not increased by water. Consequently, the original relative dielectric constant of the SiOF film is maintained, and the interconnect capacitance can also be decreased.

Figure 6:
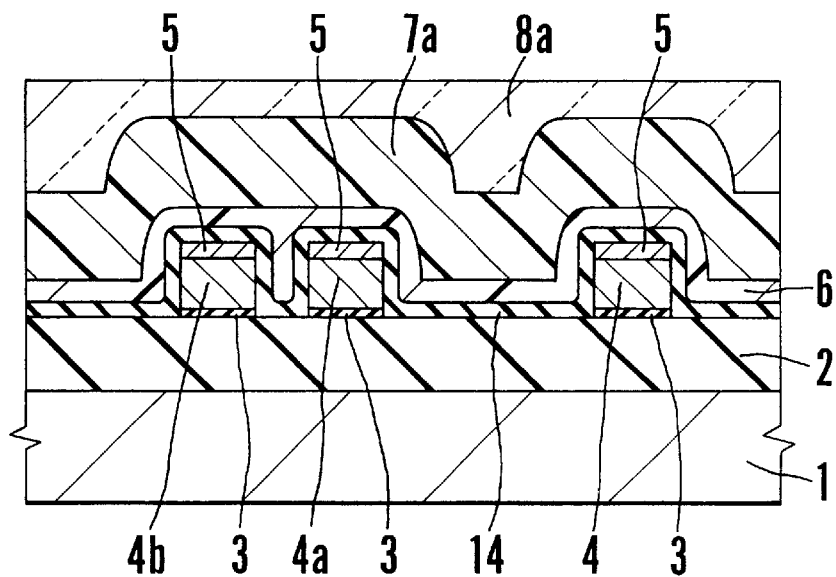
FIG. 6 is a schematic sectional view showing one principal fabrication step in the third embodiment of the present invention.

The third embodiment of the present invention will be described below with reference to FIG. 6. FIG. 6 is a sectional view showing the principal fabrication steps of this embodiment. Note that the same reference numerals as in the second embodiment denote the same parts in FIG. 6.

As shown in FIG. 6, an undercoating insulating film 2 is formed on a silicon substrate 1. Following the same procedure as in the second embodiment, an interconnecting layer is formed by stacking a first barrier layer 3, a first interconnecting layer 4, and an antireflection film 5.

A protective insulating film 14 is so formed as to cover this stacked interconnecting layer and the undercoating insulating film 2. This protective insulating film 14 is a silicon oxide film 100 nm or less in thickness deposited by PE-CVD using a gas mixture of $SiH_4$ and $N_2O$ as reaction gases. Next, an SiOF film 6 about 300 nm thick is so deposited as to cover the entire surface. As explained in the second embodiment, this SiOF film 6 is so formed that the concentration of fluorine contained in the SiOF film 6 exceeds 10 at %.

Subsequently, an intermediate insulating film 7a is deposited on this SiOF film 6. This intermediate insulating film 7a is a silicon oxide film about 600 nm thick. This silicon oxide film is formed following the same procedure as in the second embodiment. As in the second embodiment, neither water nor a hydroxyl group is contained in the intermediate insulating film 7a. Thereafter, an insulating interlayer between the interconnecting layers is planarized to form a second interconnecting layer through the same steps as explained in the second embodiment.

In this structure, even if the fluorine concentration in the SiOF film is high, no corrosion is caused by the reaction of this fluorine with the interconnecting layer such as aluminum. Also, there is no peeling of the SiOF film due to low adhesion to aluminum or TiN as the antireflection film.

What we claimed is:

1. A method of forming a multilevel interconnecting structure, comprising the steps of:
   forming a first interconnecting layer via an insulating film on a semiconductor substrate:
   forming an SiOF film as a fluorine-doped oxide film on said first interconnecting layer and said insulating film;
   forming an intermediate insulating film as an oxide film not containing fluorine on said SiOF film;
   planarizing a surface of said intermediate insulating film by an SOG film formed by coating an entire surface of said intermediate insulating film with an SOG coating solution;
   etching back surfaces of said SOG film and said intermediate insulating film by dry etching using a fluorine-based gas wherein the etching rates on a surface of said SOG film and a surface of said intermediate insulating film are set to be substantially equal to each other;
   forming a through hole reaching said first interconnecting layer in a predetermined position; and
   forming a second interconnecting layer above said intermediate insulating film and electrically connected to said first interconnecting layer.

2. A method according to claim 1, wherein said SiOF film and said intermediate insulating film are continuously deposited in the same film formation apparatus.

3. A method according to claim 1, wherein a silicon oxide film is formed on an entire surface after the etching back step.

4. A method according to claim 1, wherein said first interconnecting layer is covered with a silicon oxide film before said SiOF film is formed on said first interconnecting layer.

5. A method according to claim 1, wherein said SiOF film and said intermediate insulating film are formed by using a parallel plate PE-CVD apparatus or a high-density plasma excitation CVD apparatus.

6. A method according to claim 4, wherein a silicon oxide film is formed by using a parallel plate PE-CVD apparatus or a high-density plasma excitation CVD apparatus.

7. A method according to claim 1, wherein said SiOF film is formed by using a silane-based gas, a fluorine-based gas, and oxygen as source gases.

8. A method according to claim 1, wherein said fluorine-based gas is at least one gas selected from the group consisting of $CF_4$, $C_2F_6$, $NF_3$, and $SiF_4$.

9. A method according to claim 6, wherein said fluorine-based gas is at least one gas selected from the group consisting of $CF_4$, $C_2F_6$, $NF_3$, and $SiF_4$.

10. A method according to claim 1, wherein in the etching back step, the dry etching is to leave said buried SOG film in regions formed between said interconnecting layers.

11. A method according to claim 1, wherein in the etching back step, the dry etching is stopped before said SiOF film on said first interconnecting layer is exposed so as to leave said intermediate insulating film on said SiOF film.

12. A method according to claim 7, wherein said silane-based gas is tetraethylorthosilicate (TEOS).

13. A method according to claim 7, wherein said fluorine-based gas is triethoxyflourosilane (TEFS).

* * * * *